United States Patent [19]

Matsuda et al.

[11] Patent Number: 5,315,105
[45] Date of Patent: May 24, 1994

[54] OPTICAL OPERATIONAL MEMORY DEVICE

[75] Inventors: Kenichi Matsuda; Jun Shibata, both of Osaka, Japan

[73] Assignee: Matsushita Electric Industrial Co., Ltd., Osaka, Japan

[21] Appl. No.: 100,076

[22] Filed: Jul. 29, 1993

Related U.S. Application Data

[63] Continuation of Ser. No. 974,137, Nov. 10, 1992, abandoned.

[30] Foreign Application Priority Data

Jan. 17, 1992 [JP] Japan .................. 4-006274

[51] Int. Cl.$^5$ ............................. H01J 40/14
[52] U.S. Cl. .................... 250/214 LS; 365/112
[58] Field of Search ............. 250/214 LS, 208.1; 307/311; 365/112; 257/440, 461, 462, 463

[56] References Cited

U.S. PATENT DOCUMENTS

| | | |
|---|---|---|
| 4,506,151 | 3/1985 | MacDonald et al. .......... 250/214 LS |
| 4,782,223 | 11/1988 | Suzuki ..................... 250/214 LS |
| 5,095,200 | 3/1992 | Matsuda et al. . | |

FOREIGN PATENT DOCUMENTS 62-130861 1/1987 Japan .
3-1819200 8/1991 Japan .

*Primary Examiner*—David C. Nelms
*Assistant Examiner*—K. Shami
*Attorney, Agent, or Firm*—Ratner & Prestia

[57] ABSTRACT

An optical operational memory device comprises a light-emitting device, a first and second phototransistors, and a load resistor. The light-emitting device and the first phototransistor are connected electrically in series to form an optical bistable switch based on optical positive feedback. The second phototransistor is connected in parallel to the optical bistable switch, and the load resistor is connected in series to the optical bistable switch. The time constant given by the product of the current gain of the second phototransistor, the base-collector capacitance of the second phototransistor, and the resistance of the load resistor is larger than the period required for recombination of the excess majority carriers in the base of the first phototransistor. A single optical beam modulated with pulse signals is input to the first and the second phototransistors simultaneously. The optical pulse with a peak power in a predetermined range turns the optical bistable switch on, and the pulse with higher peak power turns the optical bistable switch off.

9 Claims, 4 Drawing Sheets

OPTICAL OPERATIONAL MEMORY DEVICE

This application is a continuation of application Ser. No. 07/974,137 filed Nov. 10, 1992, now abandoned.

FIELD OF THE INVENTION

This invention relates to an optical operational memory device applicable to optical logic operations and direct image processing in which optical signals are utilized as input and output. The device includes an optical bistable switch which is turned on and off by illuminating an identical part of the device with a single optical beam modulated with pulse signals.

BACKGROUND OF THE INVENTION

An example of a device including an optical bistable switch which is turned on and off with optical signals is the optical memory device described in the Japanese Patent Application #60-15178 (Disclosure #62-13086). The circuit of the optical memory device is shown in FIG. 6. In the circuit, the series connection of a light-emitting device 1 and a first phototransistor 2 constitutes an optical bistable switch 3. The optical bistable switch 3 is operated as follows: (1) While the bias voltage is higher than the holding voltage, which is the minimum voltage for maintaining the on-state is applied to the switch, current does not flow through the first phototransistor 2 and the light-emitting device 1 does not emit output light (off-state). (2) When input light is incident upon the first phototransistor 2 and the bias voltage is maintained above the holding voltage, the current starts to flow and the light-emitting device 1 emits output light (on-state). (3) When the illumination of input light is stopped and the bias voltage is maintained above the holding voltage, the phototransistor 2 detects the light emitted from the light-emitting device 1, and the on-state is maintained. (4) When the bias voltage is decreased beneath the holding voltage, the switch is turned off.

In the optical memory device, a second phototransistor 4 is connected in parallel to the optical bistable switch 3, and the optical bistable switch 3 can be turned off by illuminating the second phototransistor 4. This is because the current flowing through the second phototransistor 4 increases the voltage drop in the load resistor 5 and decreases the voltage applied to the optical bistable switch 3. Accordingly, the optical memory device can be turned on with set light incident upon the first phototransistor 2, and turned off with reset light incident upon the second phototransistor 4 while the bias voltage higher than the holding voltage is continuously applied.

The concrete structure of this optical memory device is shown in FIG. 7. The second phototransistor 4 is constructed with a second collector layer 7, a second base layer 8, and an emitter layer 9 on a semiconductor substrate 6; the first phototransistor 2 is with the emitter layer 9, a first base layer 10, and a first collector layer 11; and the light-emitting device 1 is with the first collector layer 11, an active layer 12, and a cladding layer 13. The cathode of the light-emitting device 1 and the collector of the first phototransistor 2 are connected electrically inside the device since they are made of the identical semiconductor layer (the first collector layer 11). In the same manner, the emitter of the first phototransistor 2 and the emitter of the second phototransistor 4 are connected. The anode of the light-emitting device 1 (the cladding layer 13) and the collector of the second phototransistor 4 (the second collector layer 7) are coupled with an external wiring 14 and connected to the anode of a power supply 15 through a load resistor 5. The internally connected emitters of the first phototransistor 2 and the second phototransistor 4 (the emitter layer 9) are connected to the cathode of the power supply 15.

In this structure, the optical signals for turning on and off the optical bistable switch 3 are introduced through the semiconductor substrate 6. The set light and the reset light are distinguished by their wavelengths. The energy bandgap of the second base layer is wider than that of the first base layer. Setting $\lambda_1$ and $\lambda_2$ as the wavelengths corresponding to the bandgaps of the first and the second base layers, the input light with a wavelength $\lambda_{ON}$ satisfying $\lambda_2 < \lambda_{ON} \leq \lambda_1$ is transmitted through the second base layer and absorbed in the first base layer. Therefore, the optical bistable switch is turned on with the input light having a wavelength $\lambda_{ON}$. On the other hand, the input light with a wavelength $\lambda_{OFF}$ satisfying $\lambda_{OFF} \leq \lambda_2$ is absorbed in the first base layer and turns off the optical bistable switch.

In the optical memory device mentioned above, two light sources are required to turn on and off the optical bistable switch since the wavelengths of the set light and the reset light are different. Two light sources are still necessary for the optoelectronic integrated circuit described in the Japanese Patent Application #1-322147 (Disclosure #3-181920) where the first and the second phototransistors are formed on separate areas of a semiconductor substrate to distinguish the set light and the reset light by spatial location and not by wavelength. On the other hand, the U.S. Pat. No. 5,095,200 (Mar. 10, 1992), incorporated herein by reference, describes an optoelectronic memory device in which the optical bistable switch can be turned on and off with a single optical beam.

In this optoelectronic memory device, the first and the second phototransistors are formed on separate areas of a semiconductor substrate, which is similar to the optoelectronic integrated circuit described in the Japanese Patent Application #1-322147. However, the input light is incident upon both the first and the second phototransistors simultaneously by using a large-diameter beam as the input light. There are two cases in which the optical bistable switch is turned on and off when the input light is incident upon the first and the second phototransistors simultaneously. Whether the optical bistable switch is turned on or off depends on the equivalent gains of the first and the second phototransistors, the value of the load resistance, and the bias voltage applied to the whole circuit. If the equivalent gains of the phototransistors and the resistance of the load resistor are set properly, the optical bistable switch can be turned on and off with a single optical beam by varying the bias voltage.

The optoelectronic memory device described above has the advantage that the optical bistable switch can be turned on and off with the identical input light. However, the optical bistable switch is not fully controlled with the optical signal since the bias voltage should be changed to distinguish the set and the reset operations. Furthermore, the equivalent gain of the first phototransistor affected by the optical positive feedback is much larger than the gain of the second phototransistor when the same structure for the first and the second phototransistors is used. To compensate for this imbalance, the portion of the input optical power incident upon the second phototransistor should be made larger than that upon the first phototransistor, which requires precise optical alignment for the input optical beam.

SUMMARY OF THE INVENTION

An optical operational memory device is described in which the optical bistable switch can be turned on and off with a single optical beam. It requires neither electrical signals for controlling the optical bistable switch nor precise optical alignment for the input optical beam. The optical operational memory device can be used not only as a memory cell with optical input and output but also as a smart pixel for optical logic operations and direct image processing.

In a first exemplary embodiment of the present invention, the optical operational memory device comprises an optical bistable switch, a second phototransistor connected in parallel to the optical bistable switch, and a load resistor connected in series to the optical bistable switch. The optical bistable switch consists of a light-emitting device and a first phototransistor. The light-emitting device and the first phototransistor are connected electrically in series, and the first phototransistor detects the light emitted from the light-emitting device. On the other hand, the second phototransistor does not detect the light emitted from the light-emitting device.

In a further exemplary embodiment of the present invention, the time constant given by the product of the current gain of the second phototransistor, the base-collector capacitance of the second phototransistor, and the resistance of the load resistor is larger than the period required for recombination of the excess majority carriers in the base of the first phototransistor. To achieve this, base-collector capacitance of the second phototransistor or the resistance of the load resistor is increased, or one of the following three methods are adopted to enhance the recombination velocity of the excess majority carriers in the base of the first phototransistor. The first method is to dope a heavy metal element in the base of the first phototransistor to generate recombination centers. The second method is to use a heterojunction with lattice mismatch as the base-emitter interface of the first phototransistor. The third method is to expose the side wall of the base in the first phototransistor to plasma to generate crystal defects.

The principle of set and reset operations with a single optical beam is described hereinafter. It is considered that the first and the second phototransistors are illuminated with equal optical powers simultaneously and that the optical power is increased gradually. Since the equivalent gain of the first phototransistor affected by the optical positive feedback is larger than the gain of the second phototransistor, the first phototransistor responds to the illumination at first. As a result, the voltage-current characteristic of the optical bistable switch becomes diode-like, while that without illumination is thyristor-like. However, as the optical power is further increased, current starts to flow through the second phototransistor. This is because the voltage applied to the second phototransistor is the same as that applied to the optical bistable switch including the light-emitting device which is a diode in view of electrical function. As a result, the voltage-current characteristic becomes transistor-like, and current flowing through the optical bistable switch is stopped.

In accordance with the change of the voltage-current characteristic, the state of the optical bistable switch is changed OFF→ON→OFF as the input optical power is increased. As it is decreased, the state is changed OFF→ON→ON because the optical bistable switch keeps the on-state once it is turned on. In other words, the optical bistable switch cannot be turned off in static mode operation. However, it can be turned off if the illumination is suddenly stopped when the optical bistable switch is in the off-state under illumination with high optical power. This dynamic reset operation is not always realized. It depends on the response time of the first and the second phototransistors.

In the base of the first phototransistor, excess majority carriers are stored when the illumination is suddenly stopped. If the bias voltage for the optical bistable switch becomes larger than the holding voltage before the excess majority carriers disappear, the optical bistable switch is turned on. On the other hand, if the bias voltage becomes larger than the holding voltage after the excess majority carriers disappear, the optical bistable switch is turned off. The bias voltage applied to the optical bistable switch is changed corresponding to the current flowing through the second phototransistor. The current through the second phototransistor starts to decrease when the illumination is stopped, and finally becomes zero. The time constant of this response is given by the product of the current gain of the second phototransistor, the base-collector capacitance of the second phototransistor, and the resistance of the load resistor. Herein, the time constant depends on the gain of the phototransistor owing to the Miller effect.

As cleared by the above explanation, the time constant $\tau_1$ given by the product of the current gain of the second phototransistor, the base-collector capacitance of the second phototransistor, and the resistance of the load resistor should be larger than the period $\tau_2$ required for recombination of the excess majority carriers in the base of the first phototransistor for the dynamic reset operation. On the other hand, whether this condition is satisfied, the optical bistable switch is turned on if the illumination is suddenly stopped with optical power is in the medium range and current flows through the optical bistable switch. Therefore, the optical bistable switch can be turned on and off with a single optical beam modulated with pulse signals. The optical pulse with a peak power in some range turns on the optical bistable switch, and the pulse with higher peak power turns off it if the condition $\tau_1 > \tau_2$ is satisfied. This condition is not satisfied in the conventional optical memory device. The condition is satisfied by making larger the load resistance, for example, though the resistance required for the dynamic reset operation is 10 time larger or more than that for the conventional static reset operation.

In a second exemplary embodiment, a load capacitor is connected in parallel to the load resistor. The load capacitor is used to slow the recovery time of the bias voltage applied to the optical bistable switch. In this case, the condition for the dynamic reset operation is that the time constant $\tau_3$ given by the product of the capacitance of the load capacitor and the resistance of the load resistor is larger than the period $\tau_2$ required for recombination of the excess majority carriers in the base of the first phototransistor.

In a third exemplary embodiment, a bypass resistor is connected between the base and the emitter of the first phototransistor. The bypass resistor is used to sweep out the excess majority carriers. The condition for the dynamic reset operation is that the time constant $\tau_1$ given by the product of the current gain of the second phototransistor, the base-collector capacitance of the second phototransistor, and the resistance of the load resistor is larger than the time constant $\tau_4$ given by the product of the base capacitance of the first phototransistor and the resistance of the bypass resistor. Herein, the base capacitance means the sum of the base emitter and base-collector capacitances. It is possible to use both the load capacitance and the bypass resistor at the same time. The general condition for the dynamic reset operation is $\tau_1 + \tau_3 > (\tau_2^{-1} + \tau_4^{-1})^{-1}$.

DETAILED DESCRIPTION OF THE INVENTION

Figure 1:
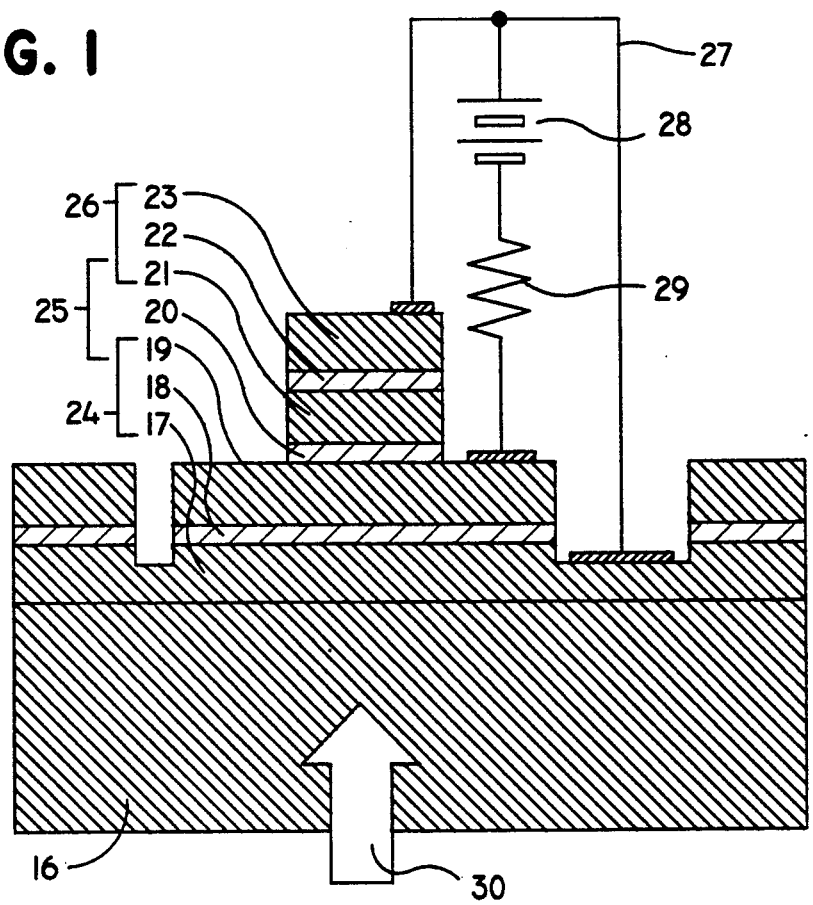
FIG. 1 is a sectional view of an optical operational memory device according to one exemplary embodiment of the present invention.

FIG. 1 is a sectional view of an optical operational memory device according to one exemplary embodiment of the present invention. A second collector layer 17 made of n-InP, a second base layer 18 made of InGaAsP (bandgap wavelength $\lambda_g = 1.1$ μm), an emitter layer 19 made of n-InP, a first base layer 20 made of InGaAsP ($\lambda_g = 1.3$ μm), a first collector layer 21 made of n-InP, an active layer 22 made of InGaAsP ($\lambda_g = 1.3$ μm), and a cladding layer 23 made of p-InP are stacked on a semiconductor substrate 16 made of n-InP. A second phototransistor 24 is constructed with the second collector layer 17, the second base layer 18, and the emitter layer 19; a first phototransistor 25 is with the emitter layer 19, the first base layer 20, and the first collector layer 21; and a light-emitting device 26 is with the first collector layer 21, the active layer 22, and the cladding layer 23. The cathode of the light-emitting device 26 and the collector of the first phototransistor 25 are connected electrically inside the device since they are made of the identical semiconductor layer (the first collector layer 21). In the same manner, the emitter of the first phototransistor 25 and the emitter of the second phototransistor 24 are connected. The anode of the light-emitting device 26 (the cladding layer 23) and the collector of the second phototransistor 24 (the second collector layer 17) are coupled with an external wiring 27 and connected to the anode of a power supply 28. The internally connected emitters of the first phototransistor 25 and the second phototransistor 24 (the emitter layer 19) is connected to the cathode of the power supply 28 through a load resistor 29.

Figure 7:
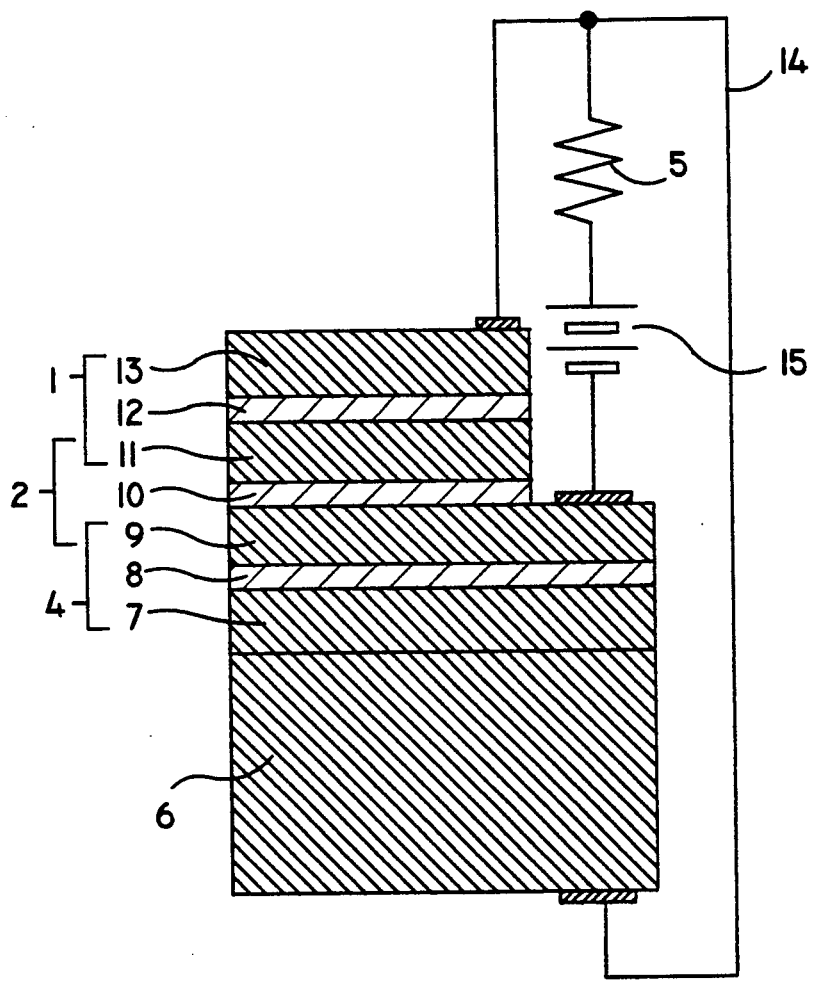
FIG. 7 is a sectional view of a conventional optical memory device.

The structure mentioned above is similar to that of a conventional optical memory device shown in FIG. 7 except that the load resistor 29 is connected to the cathode of the power supply 28. The feature of this embodiment is the parameters described below. The first phototransistor 25 has an area of 32 μm square, while the area of the second phototransistor 24 is 50 μm square. The second phototransistor has a larger area to increase the base-collector capacitance. It is 1.7 pF in this embodiment. The resistance of the load resistor 29 is 2.7 kΩ, and the current gain of the second phototransistor 24 is 300. As a result, the time constant $\lambda_1$ given by the current gain of the second phototransistor 24, the base-collector capacitance of the second phototransistor 24, and the resistance of the load resistor 29 becomes 1.4 μs. Furthermore, in this exemplary embodiment, a large $\lambda_1$ is realized by using a large load resistance and a large-area second phototransistor. The parameters determining $\lambda_1$ are not limited to the above values if the condition $\lambda_1 > \lambda_2$ is satisfied. The period $\lambda_2$ required for recombination of the excess majority carriers in the base of the first phototransistor is several hundred nanoseconds.

The operation of this exemplary embodiment is as follows: The input optical beam 30 with a wavelength shorter than 1.1 μm is introduced through the semiconductor substrate 16. A portion of the input optical beam 30 is absorbed in the second base layer 18. If the thickness of the second base layer 18 is 0.2 μm for example, approximately 30% of optical power is absorbed. As a result, 70% of the optical power is transmitted and absorbed in the first base layer 20. If the thickness of the first base layer 20 is also 0.2 μm, 30% of transmitted optical power is absorbed. Therefore, 30% of input optical power is absorbed in the second phototransistor 24, and 21% is in the first phototransistor 25. Exactly, the optical power absorbed in the second phototransistor is a little higher. However, it can be considered that the approximately equal powers are incident since the difference in equivalent gains of the first and the second phototransistors is much larger.

Figure 2:
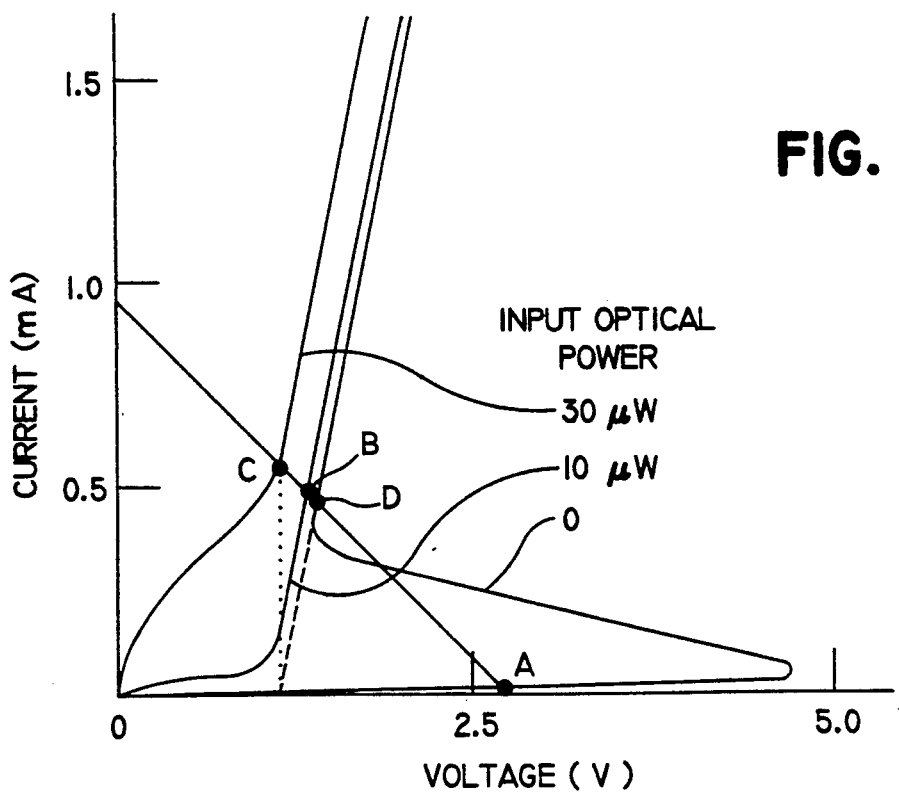
FIG. 2 is a voltage-current chart of an optical operational memory device according to an exemplary embodiment of the present invention.

The voltage-current characteristics of this embodiment are shown in FIG. 2 in which the power of input optical beam 30 is a parameter. Without illumination, current does not flow through the second phototransistor 24, and the optical bistable switch consisting of the light-emitting device 26 and the first phototransistor 25 exhibits thyristor-like characteristics. When the input optical power is 10 μW, the first phototransistor responds it and the optical bistable switch shows diode-like characteristic. Since the gain of the second phototransistor is lower than that of the first phototransistor, little current flows through the second phototransistor. When the input optical power is further increased to 30 μW, current starts to flow through the second phototransistor. Since the same voltage is applied to the optical bistable switch and the second phototransistor, it is easier for current to flow through the second phototransistor than through the optical bistable switch including the light-emitting device which is a diode in view of electrical function. As a result, the characteristic becomes transistor-like.

The load line determined by the bias voltage of 2.6 V and the load resistance of 2.7 kΩ is also plotted in FIG. 2. As increasing the input optical power, the bias point moved from A without illumination to B with a power of 10 μW. When the optical power is further increased to 30 μW, it is moved to C where all current flows through the second phototransistor and the optical bistable switch is in the off-state. As the input optical power decreases, the optical bistable switch assumes the on-state again (B), and the on-state is maintained after illumination is stopped (D). Therefore, the bias point is moved C→B→D in static mode operation. The final point D corresponds to the on-state, that is, the switch is turned on with illumination. The switch cannot be turned off with the input optical beam in the static mode operation.

Then it is considered that the illumination is suddenly stopped when the input optical power is 30 μW. Whether the optical bistable switch is turned on or off depends on the response time of the first and the second phototransistors. In the base of the first phototransistor, excess majority carriers are stored when the illumination is suddenly stopped. If the bias voltage for the optical bistable switch becomes larger than the holding voltage before the excess majority carriers disappear, the optical bistable switch is turned on. On the other hand, if the bias voltage becomes larger than the holding voltage after the excess majority carriers disappear, the optical bistable switch is turned off. The bias voltage applied to the optical bistable switch is changed corresponding to the current flowing through the second phototransistor. The current through the second phototransistor starts to decrease when the illumination is stopped, and finally becomes zero. The time constant of this response is given by the product of the current gain of the second phototransistor, the base-collector capacitance of the second phototransistor, and the resistance of the load resistor. In this exemplary embodiment, the time constant $\lambda_1$ given by the product of the current gain of the second phototransistor, the base-collector capacitance of the second phototransistor, and the resistance of the load resistor is 1.4 μs, while the period $\lambda_2$ required for recombination of the excess majority carriers in the base of the first phototransistor is several hundred nanoseconds.

Figure 3:
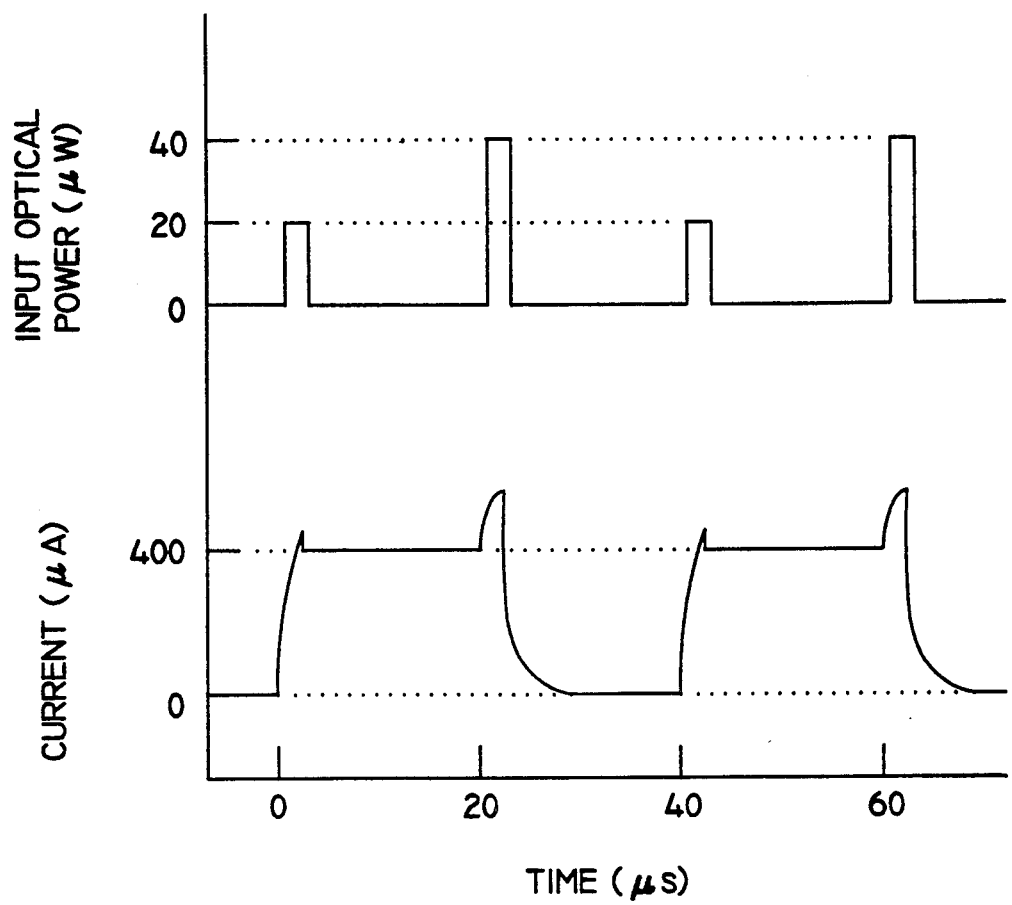
FIG. 3 is a dynamic operation chart of an optical operational memory device according to an exemplary embodiment of the present invention.

Therefore, the optical bistable switch is turned off if the illumination with an input optical power higher than 30 μW is suddenly stopped. On the other hand, the optical bistable switch is turned on if the illumination with an input optical power between 10 and 30 μW is suddenly stopped. These operations are demonstrated in FIG. 3. A 0.98 μm laser diode used as an optical source is modulated to generate optical pulses with peak powers of 20 μW and 40 μW. Both pulses have a width of 2 μs and are repeated alternatively with a period of 20 μs. The voltage drop proportional to the current through the load resistor is monitored with an oscilloscope. The current of 400 μA observed after input of a 20 μW pulse means that the optical bistable switch is turned on with the pulse. After input of a 40 μW pulse, the current decays to 0, that is, the optical bistable switch is turned off with the pulse.

An exclusive-OR operation can be executed by using this embodiment since it has a set threshold power of 10 μW and a reset threshold power of 30 μW. Considering the case that the optical signals A and B, each of which has optical power between 15 and 30 μW, are controlled independently and input simultaneously to it, the optical bistable switch is turned on only when either A or B is incident. This is an exclusive-OR operation if the state of "1" or "0" is defined by whether the optical signals are incident and whether the output light is emitted. Furthermore, the half-tone detecting for an image data can be realized with a large-scale two-dimensional array in which this embodiment is used as a pixel. When an image data with gradation is incident upon the array, the pixels illuminated by half-tone with medium power are turned on and emit light, while those by white or black are turned off.

In this embodiment, the second phototransistor with a large area and the load resistor with a large resistance is adopted to satisfy the condition that the time constant $\lambda_1$ given by the product of the current gain of the second phototransistor, the base-collector capacitance of the second phototransistor, and the resistance of the load resistor is larger than the period $\lambda_2$ required for recombination of the excess majority carriers in the base of the first phototransistor. The condition $\lambda_1 > \lambda_2$ is satisfied also by adopting one of the following three methods to enhance the recombination velocity of the excess majority carriers in the base of the first phototransistor. The first is that a heavy metal element is doped in the base of the first phototransistor to generate recombination centers. The second is that a heterojunction with lattice mismatch is used as the base-emitter interface of the first phototransistor. The third is the side wall of the base in the first phototransistor is exposed to plasma to generate crystal defects. All of these methods degrade the static characteristic of the first phototransistor, especially optical gain in low current region, and increase the dissipation power and the input optical power for controlling the optical bistable switch though they are tradeoffs for the switching speed and can be optimized corresponding to the application.

Figure 4:
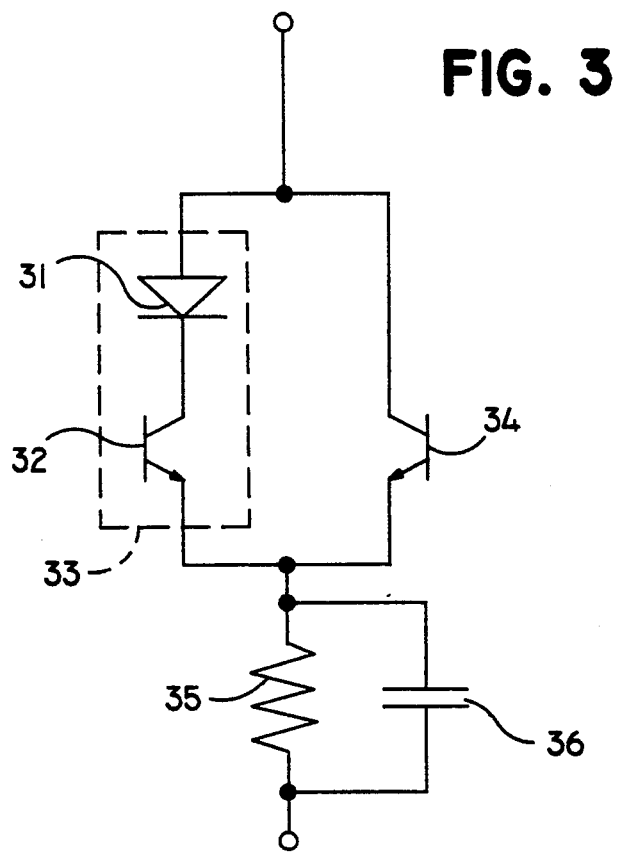
FIG. 4 is a circuit diagram of an optical operational memory device according to a second exemplary embodiment of the present invention.

FIG. 4 is a circuit diagram of an optical operational memory device according to a second exemplary embodiment of the present invention. In this embodiment, an optical bistable switch 33 consists of a light-emitting device 31 and a first phototransistor 32 connected in series. A second phototransistor 34 is connected in parallel to the optical bistable switch 33, and a parallel circuit of a load resistor 35 and a load capacitor 36 is connected in series to the optical bistable switch 33. The load capacitor 36 is used to slow the recovery time of the bias voltage applied to the optical bistable switch 33. In this case, the condition for the dynamic reset operation is that the time constant $\lambda_3$ given by the product of the capacitance of the load capacitor 36 and the resistance of the load resistor 35 is larger than the period $\lambda_2$ required for recombination of the excess majority carriers in the base of the first phototransistor 32. For example, in case of using a load resistance of 2.7 kΩ and a load capacitance of 500 pF, $\lambda_3$ becomes 1.4 μs and the condition $\lambda_3 > \lambda_2$ is satisfied.

Figure 5:
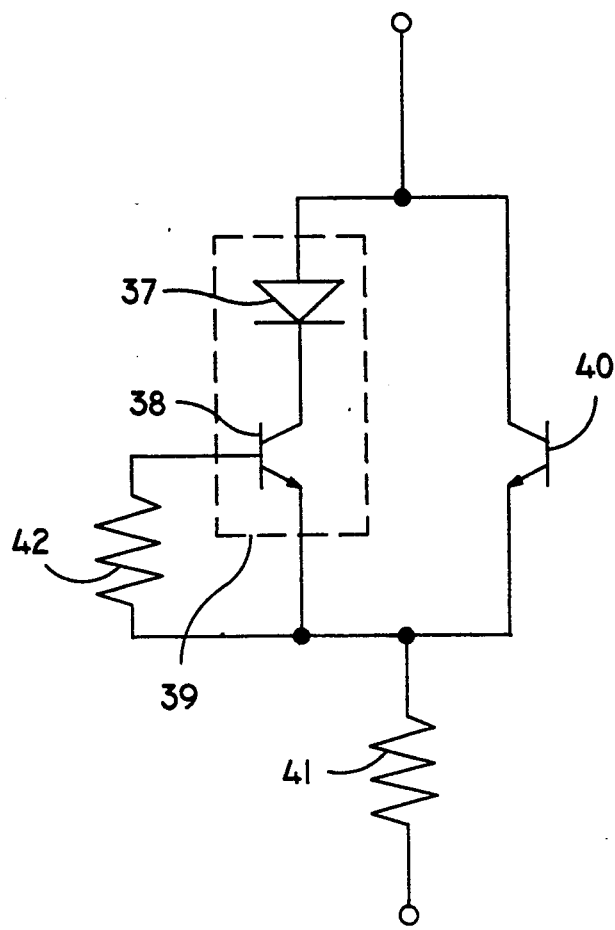
FIG. 5 is a circuit diagram of an optical operational memory device according to a third exemplary embodiment of the present invention.
Figure 6:
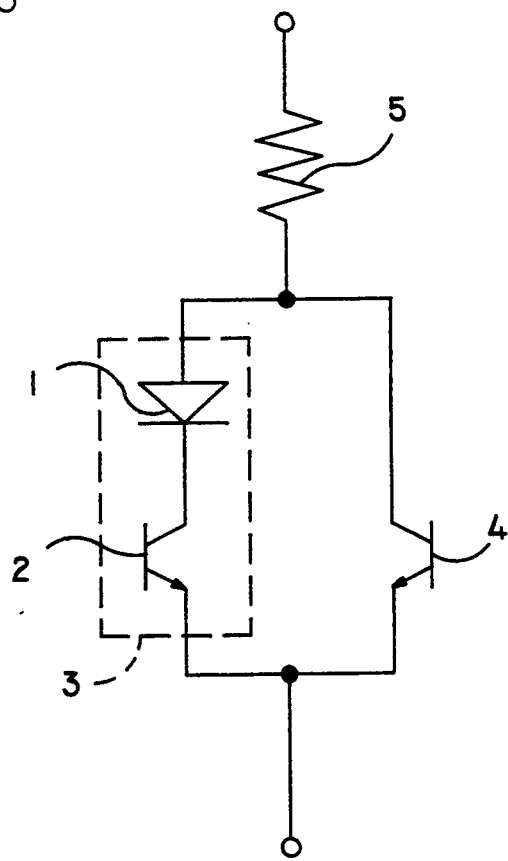
FIG. 6 is a circuit diagram of a conventional optical memory device.

FIG. 5 is a circuit diagram of an optical memory device according to a third exemplary embodiment of the present invention. In this embodiment, a optical bistable switch 39 consists of a light-emitting device 37 and a first phototransistor 38 connected in series. A second phototransistor 40 is connected in parallel to the optical bistable switch 39, and a load resistor 41 is connected in series to it. A bypass resistor 42 is connected between the base and the emitter of the first phototransistor 38.

What is claimed:
1. An optical operational memory device comprising:
an optical bistable switch including a light-emitting device and a first phototransistor connected in series, said first phototransistor detecting the light emitted from said light-emitting device,
a second phototransistor connected in parallel to said optical bistable switch, and
a load resistor connected in series to said optical bistable switch, wherein the time constant given by the prod- uct of the current gain of said second phototransistor, the base-collector capacitance of said second phototransistor, and the resistance of said load resistor is larger than the period required for recombination of the excess majority carriers in the base of said first phototransistor.

2. An optical operational memory device according to claim 1, wherein said second phototransistor, said first phototransistor, and said light-emitting device are sequentially stacked on a semiconductor substrate.

3. An optical operational memory device according to claim 1, wherein the base of said first phototransistor contains recombination centers generated by doping a heavy metal element.

4. An optical memory device according to claim 1, wherein the base-emitter interface of said first phototransistor is a heterojunction with lattice mismatch.

5. An optical operational memory device according to claim 1, wherein said second phototransistor does not detect light emitted from said light-emitting device.

6. An optical operational memory device comprising:
an optical bistable switch having a light-emitting device and a first phototransistor connected in series, said first phototransistor detecting the light emitted from said light-emitting device,
a second phototransistor connected in parallel to said optical bistable switch, said second phototransistor does not detect the light emitted from said light-emitting device,
a load resistor connected in series to said optical bistable switch, and
a load capacitor connected in parallel to said load resistor;
wherein the time constant given by the product of the capacitance of said load capacitor and the resistance of said load resistor is larger than the period required for recombination of the excess majority carriers in the base of said first phototransistor.

7. An optical operational memory device of claim 6 wherein said second phototransistor, said first phototransistor, and the light-emitting device are sequentially stacked on a semiconductor substrate.

8. An optical operational memory device comprising:
an optical bistable switch having a light-emitting device and a first phototransistor connected in series, said first phototransistor detecting the light emitted from said light-emitting device,
a second phototransistor connected in parallel to said optical bistable switch, said second phototransistor does not detect the light emitted from said light-emitting device,
a load resistor connected in series to said optical bistable switch, and
a bypass resistor connected between the base and the emitter of said first phototransistor;
wherein the time constant given by the product of the current gain of said second phototransistor, the base-collector capacitance of said second phototransistor, and the resistance of said load resistor is larger than the time constant given by the product of the base capacitance of said first phototransistor and the resistant of said bypass resistor.

9. An optical operational memory device of claim 8 wherein said second phototransistor, said first phototransistor, and the light-emitting device are sequentially stacked on a semiconductor substrate.

* * * * *